United States Patent
Nawata et al.

(10) Patent No.: US 7,589,911 B2
(45) Date of Patent: Sep. 15, 2009

(54) TECHNIQUE FOR POSITIONING OPTICAL SYSTEM ELEMENT

(75) Inventors: Ryo Nawata, Tochigi (JP); Hiroshi Ito, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 926 days.

(21) Appl. No.: 10/942,564

(22) Filed: Sep. 16, 2004

(65) Prior Publication Data

US 2005/0063288 A1 Mar. 24, 2005

(30) Foreign Application Priority Data

Sep. 18, 2003 (JP) ............................. 2003-326933
Jan. 23, 2004 (JP) ............................. 2004-015832

(51) Int. Cl.
*G02B 15/14* (2006.01)
(52) U.S. Cl. ...................................... 359/694; 359/695
(58) Field of Classification Search ................. 359/694
See application file for complete search history.

(56) References Cited

U.S. PATENT DOCUMENTS 5,099,352 A * 3/1992 Yamamoto et al. ....... 359/213.1
6,166,812 A * 12/2000 Ueda ........................ 356/401
2002/0176082 A1* 11/2002 Sakakibara et al. ......... 356/400

FOREIGN PATENT DOCUMENTS

| JP | 2000-357651 | 12/2000 |
|----|-------------|---------|
| JP | 2002-131605 | 5/2002  |
| JP | 2003-045356 | 2/2003  |

* cited by examiner

*Primary Examiner*—Jordan M. Schwartz
*Assistant Examiner*—James C Jones
(74) *Attorney, Agent, or Firm*—Rossi, Kimms & McDowell, LLP

(57) ABSTRACT

An apparatus includes an optical system having a first element and a second element, and a support member which supports the optical system. The apparatus further includes a first control system which includes the first element and feedback-controls a position of the first element, and a second control system which includes the second element and feedback-controls a position of the second element. The first control system and the second control system are arranged such that a difference between a first transfer function between a displacement of the support member and a displacement of the first element and a second transfer function between the displacement of the support member and a displacement of the second element is not greater than 1/10 with respect to at least a limited frequency band.

12 Claims, 7 Drawing Sheets

TECHNIQUE FOR POSITIONING OPTICAL SYSTEM ELEMENT

BACKGROUND OF THE INVENTION

1. Field of the Invention

The present invention generally relates to a technique for positioning an optical system element. In particular, the present invention relates to a technique for positioning of a projection optical system element (lens, mirror, or the like) of an exposure apparatus used in a process for fabricating various devices including a semiconductor chip such as an IC or an LSI, a display device such as a liquid crystal panel, a detection device such as a magnetic head, and an image pickup device such as a CCD, and an exposure apparatus using the projection optical system. The present invention is suitable for, for example, positioning an optical system element in an exposure apparatus using extreme ultraviolet (EUV) light as exposure light (hereinafter referred to as "an EUV exposure apparatus").

2. Related Background Art

A semiconductor exposure apparatus is an apparatus for transferring a large number of original plates (reticles) having different kinds of patterns onto a silicon wafer (substrate). When a high integration circuit is produced, it is essential to improve not only a resolution performance but also overlay precision.

Overlay errors in the semiconductor exposure apparatus are classified into an alignment error, an image distortion, and a magnification error. The alignment error can be reduced by adjusting a relative displacement between the original plate (reticle) and the substrate (wafer). On the other hand, the image distortion and the magnification error can be adjusted by moving at least one optical element which is a part of an optical system. When the optical element is moved, it is necessary to prevent a parallel decentration amount and a tilt decentration amount from increasing.

Up to now, there has been proposed an exposure apparatus in which a sensor for continuously detecting a distance from a fixed portion to an optical element is provided to control the posture of the optical element in real time (for example, see Japanese Patent Application Laid-Open Nos. 2000-357651 and 2002-131605). There has been also known a positioning control mechanism for controlling the six axes of an optical element (for example, see Japanese Patent Application Laid-Open No. 2001-231077).

In recent years, in order to obtain a necessary imaging relationship while a resolution of a semiconductor device pattern, higher drive positioning precision for correcting a position, posture precision, aberration, and the like is being required for the optical element as compared with a conventional case. As a factor deteriorating such positioning precision, there is a disturbance. In conventional positioning control, an influence of the disturbance can be ignored. However, with higher positioning precision being demanded, the influence of the disturbance cannot be ignored. According to, for example, Japanese Patent Application Laid-Open Nos. 2000-357651 and 2002-131605, when a disturbance is transmitted from a floor or the like to a lens barrel in the device for controlling the positioning of the optical elements to only the fixed portion or the lens barrel, the respective optical elements randomly vibrate to cause a synchronization error. Therefore, a problem occurs in that the required imaging performance cannot be obtained.

SUMMARY OF THE INVENTION

An illustrative object of the present invention is to provide a positioning technique for suppressing a positional displacement, due to a disturbance, of a first optical system element relative to a second optical system element.

According to the present invention, the foregoing object is attained by providing an apparatus which includes an optical system having a first element and a second element, and a support member which supports said optical system, said apparatus comprises a first control system which includes said first element and feedback-controls a position of said first element, and a second control system which includes said second element and feedback-controls a position of said second element, wherein said first control system and said second control system are arranged such that a difference between a first transfer function between a displacement of said support member and a displacement of said first element and a second transfer function between the displacement of said support member and a displacement of said second element is not greater than $1/10$ with respect to at least a limited frequency band.

Further, the forgoing object is also attained by providing an apparatus which includes an optical system having a first element and a second element, and a support member which supports said optical system, said apparatus comprising a detection system which detects a position of said first element, and a second control system which includes said second element and feedback-controls a position of said second element, wherein said second control system controls the position of said second element so as to keep predetermined relative position between said first element and said second element, based on a detection result by said detection system.

Further, the forgoing object is also attained by providing an apparatus which includes an optical system having a first element and a second element, comprising a base, a first support system which supports said first element on said base, and a second support system which supports said second element on said base, wherein said first support system and said second support system are arranged such that a difference between a product of a primary natural frequency and an attenuation factor of said first support system and a product of a primary natural frequency and an attenuation factor of said second support system is not greater than 20% of the product of said first support system.

According to the present invention, it is possible to provide a positioning technique for suppressing a positional displacement between a plurality of optical system elements influenced by a disturbance.

Other objects and advantages besides those discussed above shall be apparent to those skilled in the art from the description of a preferred embodiment of the invention which follows. In the description, reference is made to accompanying drawings, which form apart thereof, and which illustrate an example of the invention. Such example, however, is not exhaustive of the various embodiments of the invention, and therefore reference is made to the claims which follow the description for determining the scope of the invention.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Hereinafter, an embodiment of the present invention will be described in detail with reference to the accompanying drawing.

Figure 8:
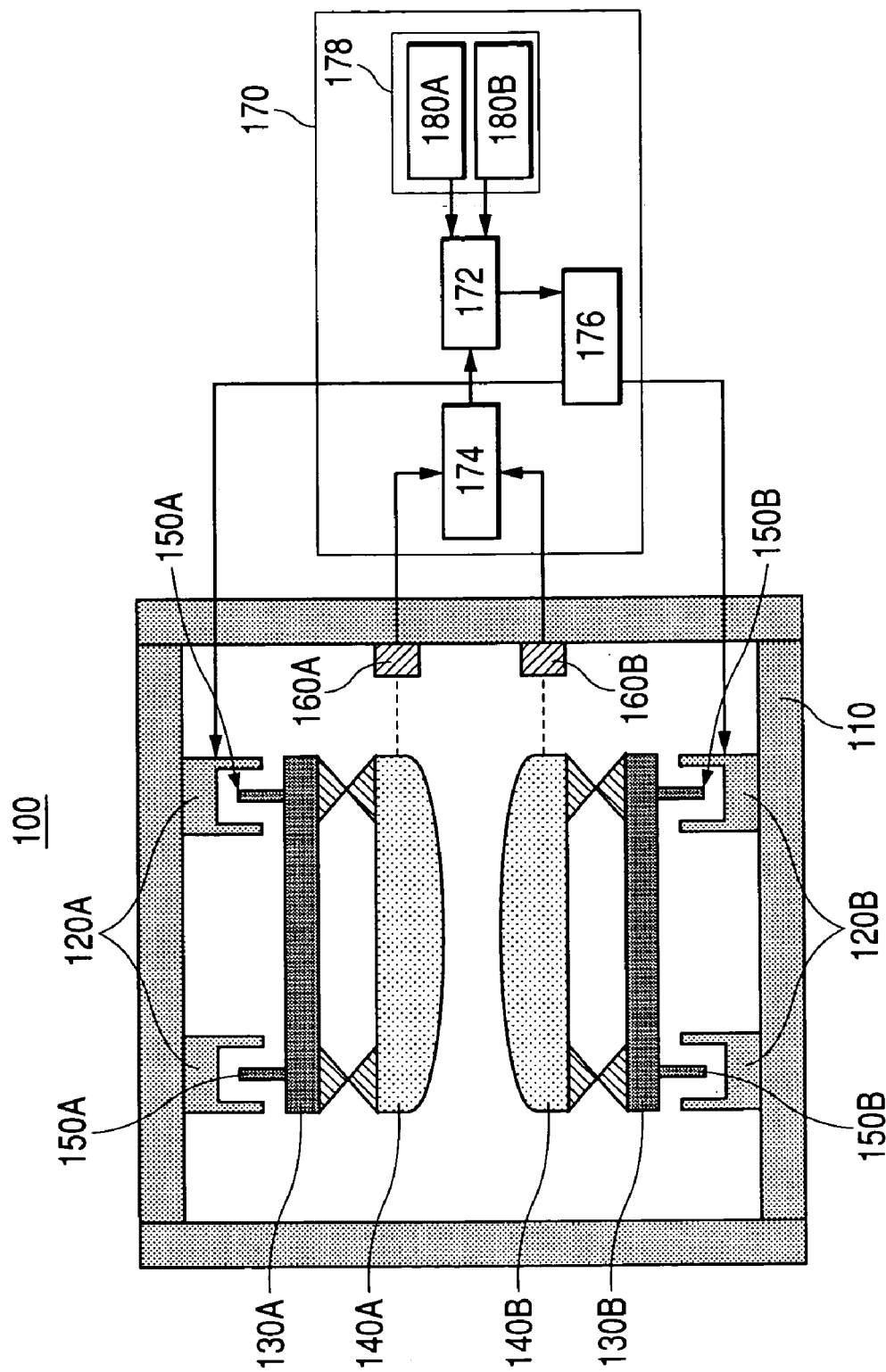
FIG. 8 is a schematic block diagram for explaining a positioning control device of the present invention.
Figure 9:
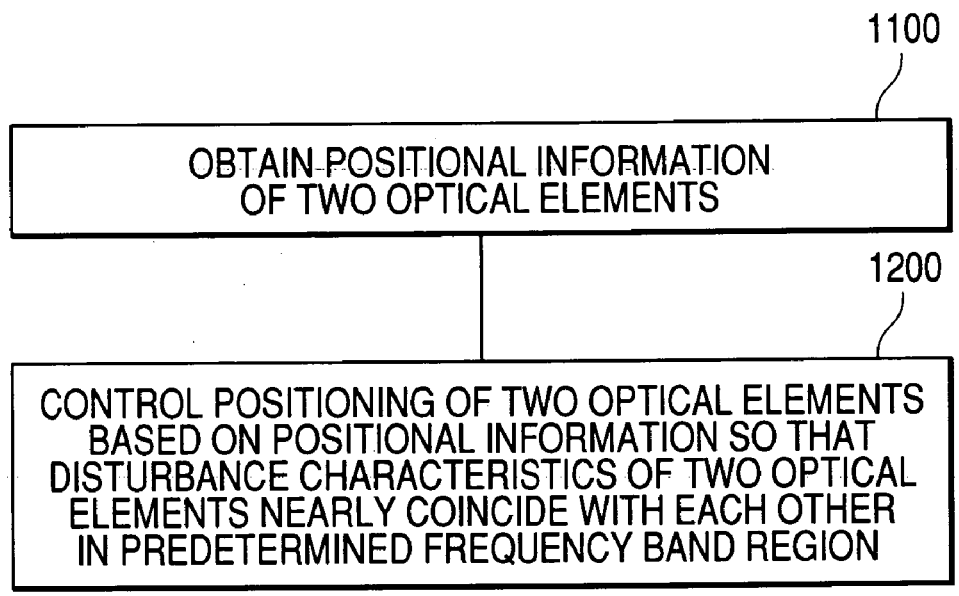
FIG. 9 is a flow chart for explaining a positioning control method shown in FIG. 8.

Hereinafter, an outline of a positioning control method of the present invention will be described with reference to FIGS. 8 and 9. FIG. 8 is a schematic block diagram showing a positioning control device 100 of the present invention. FIG. 9 is a flow chart showing the positioning control method of the present invention. As shown in FIG. 8, the positioning control device 100 includes a frame 110 such as a lens barrel, fixed portions 120A and 120B fixed to the frame 110, movable portions 130A and 130B, optical elements 140A and 140B, drive portions 150A and 150B, measurement portions 160A and 160B, and a PC 170 (which is not limited to a personal computer and may be replaced by another constituent element serving as calculation means). The PC 170 includes a CPU 172 and memories 174, 176, and 178. The memory 178 serves for compensators 180A and 180B (for example, PID compensators). Assume that elements denoted by reference numerals with which uppercase alphabetic characters are added thereto will be collectively denoted by reference numerals with no alphabetic characters.

The optical elements 140 are fixed to the fixed portions 120 through the movable portions 130 and the drive portions 150 and varied by the influence of a disturbance from the frame 110. The fixed portions 120 are fixed to the frame 110 so as to be immovable and support the movable portions 130 and the optical elements 140. The movable portions 130 move the optical elements 140 in a predetermined direction (for example, one or plural directions out of six axis directions including three axis directions orthogonal to one another and rotational directions related to the respective axes) and are driven by the drive portions 150. The drive portions 150 are controlled based on information from the compensators 180 by the CPU 172. The measurement portions 160 measure positions (or postures) or rotations of the optical elements 140 in the predetermined direction. In general, the number of the measurement portions 160 is the same as that of measurement directions. Therefore, in the case of six-axis control, six measurement portions 160 are provided for each of the optical elements 140. Measurement results obtained by the measurement portions 160 are stored in the memory 174 in the PC 170.

On the other hand, compensation drive data for the respective drive portions are sent from the compensators 180 of the memory 178 to the CPU 172. The CPU 172 causes the memory 176 to store positioning control data with reference to the measurement results stored in the memory 174. The positioning control data are supplied from the memory 176 to the drive portions 150, thereby controlling the drive portions 150.

The control operation is performed according to the positioning control method program stored in the memory 178 or another memory.

Referring to FIG. 9, first, the control portion 180 obtains positional information of each of the two optical elements 140 from the memory 174 (Step 1100). Next, in Step 1200, the CPU 172 produces positioning control data for the two optical elements 140 with reference to the data from the memory 178 so that disturbance characteristics of the two optical elements 140 nearly coincide with each other in a predetermined frequency band region based on the positional information. Then, the CPU causes the memory 176 to store the positioning control data. The drive portions 150 are controlled based on the positioning control data stored in the memory 176. As a result, a variation in relative displacement between the optical elements 140 can be reduced.

In at least two positioning devices for positioning at least two optical elements on the same structural member, transfer characteristics (transmissibilities in a specific frequency band region) of disturbances to the optical elements are determined by transfer characteristics of the positioning devices serving as controlled objects and transfer characteristics of control systems for the positioning devices. With respect to a frequency band region equal to or larger than a crossover frequency in the control systems, the transfer characteristics of the disturbances are determined by the transfer characteristics of the controlled objects. With respect to a frequency band region smaller than the crossover frequency in the control systems, the transfer characteristics of the disturbances are determined by the transfer characteristics of the control systems.

With respect to the frequency band region equal to or larger than the crossover frequency in the control systems, in order to control a synchronization error of the two optical elements caused by a disturbance within an allowable range, the transfer characteristics of the controlled objects may be made to coincide with each other, thereby controlling a difference between the transfer characteristics of the controlled objects within a predetermined range. Therefore, first, it is necessary to use a positioning method based on the same fundamental for each of the positioning devices for the two optical elements. The characteristics of the controlled objects are determined by masses and moments of inertia, rigidities, attenuation factors, and the like with respect to the optical elements 140, the movable portions 130, the fixed portions 120, the drive portions 150, and the like. Thus, in order to control the synchronization error of the two optical elements caused by the disturbance within an allowable range, it is necessary to design the positioning devices for the optical elements serving as the controlled objects such that the transfer characteristics of the controlled objects are made to coincide with each other, thereby controlling a difference between the transfer characteristics of the controlled objects within the predetermined range. In embodiments described later, specifically, a difference between transmissibilities (transfer functions) to the fixed portions (here the fixed portions may be the lens barrel or a part of the lens barrel, or a base, a floor, or the like may be considered to be the fixed portions) supporting the movable portions including the two optical elements is desirably within 20% of one transmissibility (or the difference may be 80% to 125% of the one transmissibility). The difference is more preferably within 10% of one transmissibility (or the difference may be 90% to 111% of the one transmissibility). The difference between the transmissibilities may be 1/10 of one transmissibility or less, more preferably, 1/100 of one transmissibility or less.

With respect to the frequency band region smaller than the crossover frequency in the control systems, in order to control a synchronization error of vibrations of the two optical elements caused by the disturbance within an allowable range, the transfer characteristics of the control systems may be made to coincide with each other. That is, the difference between the transfer characteristics of the control systems may be controlled within a predetermined range (difference between transfer characteristics in a specific frequency band region may be controlled within the allowable range). It is ideal that the transfer characteristics of the control systems of the positioning devices for the two optical elements completely coincide with each other. The transfer characteristics with respect to the predetermined frequency band region can be made to coincide with each other, thereby controlling the difference between the transmissibilities of the control systems within the predetermined range with respect to the predetermined frequency band region.

For example, when an integrator is used as the compensator of each of the control systems, the predetermined frequency band region is a frequency band region equal to or smaller than a break frequency of the integrator. For example, when an integrator and a differentiator are used for the compensator of each of the control systems, the predetermined frequency band region is a frequency band region between the break frequency of the integrator and a break frequency of the differentiator.

The allowable range related to the difference between the transmissibilities of the disturbances to the two optical elements can be determined by an allowable synchronization error of the two optical elements and a vibration amplitude of a structural frame supporting the optical elements, which is caused by floor vibration. The vibration amplitude of the structural frame can be obtained from a vibration amplitude of a floor, a natural frequency of a vibration-free mount, and an attenuation factor of the vibration-free mount.

When the vibration amplitude of the floor is set to 0.1 [μm], the natural frequency of the mount of the structural frame is set to 1 [Hz], and the attenuation factor $\zeta$ of the mount is set to 0.1, the vibration amplitude of the structural frame which is caused by the floor vibration becomes about 1 [nm]. Because the allowable synchronization error of the two optical elements to satisfy a required imaging relationship is about 0.1 [nm], it is necessary to control the difference between the transmissibilities of the disturbances within a range of 1/10(=0.1 [nm]/1 [nm]) or less. That is, it is preferable that the difference between the transmissibility of the disturbance to a first optical element of the two optical elements and the transmissibility of the disturbance to a second optical element thereof is 1/10 or less of the transmissibility of the disturbance to the first optical element.

If the difference between the transmissibilities of the disturbances to the two (plural) optical elements exceeds 1/10, a relative position of the two optical elements is significantly deviated from a predetermined relative position, so that the entire optical characteristics deteriorates.

The case of using a floor having a slightly lower performance than the above-mentioned floor is assumed. Here, when the vibration amplitude of the floor is set to 1 [μm], the natural frequency of the mount of the structural frame is set to 1 [Hz], and the attenuation factor $\zeta$ of the mount is set to 0.1, the vibration amplitude of the structural frame which is caused by the floor vibration becomes about 10 [nm]. Because the allowable synchronization error of the two optical elements to satisfy the required imaging relationship is about 0.1 [nm], it is necessary to control the difference between the transmissibilities of the disturbances within a range of 1/100(=0.1 [nm]/10 [nm]) or less.

It is preferable that the transmissibilities (transfer characteristics) of the disturbances to the movable portions such as mirrors, mask stages, or wafer stages nearly coincide with each other in a relatively low frequency region. It is preferable that the transmissibilities of the disturbances nearly coincide with each other in a predetermined frequency band region equal to or smaller than 80 Hz. It is more preferable that the transmissibilities of the disturbances nearly coincide with each other in a frequency band region equal to or smaller than 100 Hz.

In this case, a width of the frequency band region in which the transmissibilities of the disturbances nearly coincide with each other is preferably 10 Hz or more. It is more preferable that the width of the frequency band region in which the transmissibilities of the disturbances nearly coincide with each other is 15 Hz or more.

Hereinafter, a range of the disturbance characteristics whose coincidence is required will be specifically described with reference to embodiments.

Embodiment 1

Figure 1:
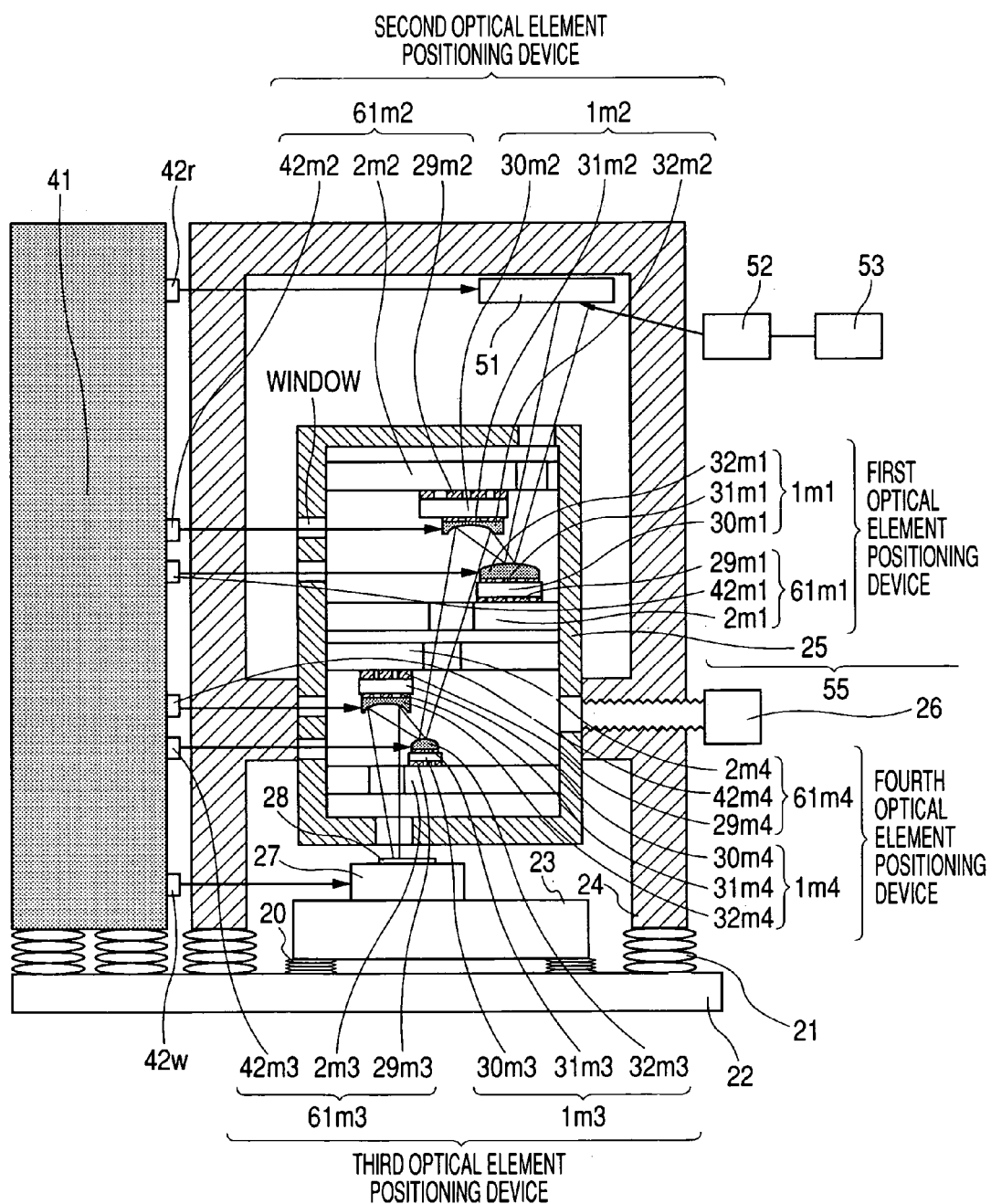
FIG. 1 shows a simplified optical path of an exposure apparatus according to an embodiment of the present invention.

Hereinafter, an exposure apparatus and an optical element control method according to Embodiment 1 of the present invention will be described. The exposure apparatus according to this embodiment is an illustrated EUV exposure apparatus. As shown in FIG. 1, the exposure apparatus includes a light source 53, an illumination optical system 52, a reticle stage 51 holding an original plate (mask, reticle), a projection optical system 55, and a wafer stage 27 holding a substrate (such as a wafer). Here, FIG. 1 shows a simplified optical path of the exposure apparatus.

The light source 53 generates, for example, EUV light. For an exposure apparatus using light having a wavelength of 2 nm to 40 nm (for example, EUV light or X-ray) as exposure light, a reflection optical element such as a mirror is used. This is because absorption caused by a substance becomes very large in such a wavelength range, and a lens optical system utilizing light refraction, which is used in the case of visible light or ultraviolet light, is impractical. In this case, for example, a reflection reticle in which a pattern to be transferred by an absorber is formed on a multi-layer film reflection mirror is used for the original plate. Such a reflection optical element utilizes light reflection. Therefore, when the optical element is tilted by the influence of the disturbance, reflection light is particularly likely to be influenced by the tilt. Thus, the present invention is particularly effective to the exposure apparatus using the light having the wavelength of 2 nm to 40 nm (for example, EUV light or X-ray) as the exposure light.

For example, a laser plasma light source is used as the light source 53. This light source emits high intensity pulse laser light to a target material in a vacuum chamber to generate high temperature plasma, thereby utilizing, for example, EUV light having a wavelength of about 13 nm, which is radiated from the plasma. Any technique known in the art can be applied to the light source for emitting the EUV light and therefore the detailed description is omitted here.

The exposure light (EUV light) emitted from the light source 53 passes through the illumination optical system 52. The pattern on the original plate is irradiated with the exposure light. The illumination optical system 52 has a function for transmitting the EUV light to illuminate the original plate. The illumination optical system 52 includes a plurality of mirrors, an optical integrator, and an aperture. The optical integrator has a function for uniformly illuminating the original plate at a predetermined numerical aperture. The aperture is provided at a position conjugate with the original plate and limits an illuminated region on the surface of the original plate to an arc shape.

The EUV light selectively reflected on the original plate is reduced in size and projected on a wafer 28 to which a resist is applied by the projection optical system 55 composed of several reflection mirrors. Therefore, the pattern on the original plate is transferred to the wafer 28.

The positioning of the reticle stage 51 is controlled in six axis directions relative to a reference structural member 41 by a non-contact measurement means 42$r$, a drive mechanism (not shown), and a compensator (not shown). Here, the six axis directions are X-, Y-, and Z-axis directions and rotational directions about the X-, Y-, and Z-axes. Any method known in the art such as the method described in Japanese Patent Application Laid-Open No. 2001-231077 can be used for positioning. The compensator calculates an instruction value to the drive mechanism based on measurement information from the non-contact measurement means 42$r$. A PID compensator is used as the compensator. The non-contact measurement means includes, for example, a laser interferometer.

In order to obtain a preferable image by reducing aberration of the projection optical system 55, an illumination region onto the original plate and a projection image to the wafer 28 are limited to an area which is extremely narrow, have the same image height, and are formed in an arc shape. Therefore, in order to expose the wafer 28 to the entire pattern formed on the original plate, the exposure apparatus 100 employs a so-called scan exposure method of performing exposure during scanning in synchronization between the reticle stage 51 and the wafer stage 27.

The wafer stage 27 is located such that a surface on which the wafer 28 is mounted intersects the optical axis of the projection optical system 55. The positioning of the wafer stage 27 is controlled in six axis directions relative to the reference structural member 41 by a non-contact measurement means 42$w$, a drive mechanism 71$w$ (not shown), and a compensator 33$w$ (not shown). The compensator 33$w$ calculates an instruction value to the drive mechanism 71$w$ based on measurement information from the non-contact measurement means 42$w$. A PID compensator is used as the compensator 33$w$. The six-axis control for the reticle stage is identical to the six-axis control for the wafer stage.

Next, the projection optical system 55 will be described. The projection optical system 55 shown in FIG. 1 is composed of four multi-layer film reflection mirrors. The projection optical system 55 may be composed of a plurality of mirrors such as two, six, or eight mirrors. In the irradiation order of the exposure light, a first optical element is referred to as an optical element 32$m$1 and a second optical element is referred to as an optical element 32$m$2. A shape of the reflection surface of each of the mirrors is a convex surface, a concave spherical surface, or an aspherical surface. A numerical aperture NA is about 0.2 to 0.3.

An optical element micro-motion mechanism 61 will be described with reference to an optical element micro-motion mechanism 61$m$1 for the first optical element 32$m$1. The optical element micro-motion mechanism 61$m$1 includes a non-contact measurement means 42$m$1 for measuring a position of a first movable portion 1$m$1 from the reference structural member 41, a drive mechanism 29$m$1 for driving the first movable portion 1$m$1, and a compensator (not shown) for sending an instruction value to the drive mechanism 29$m$1 based on measurement information from the non-contact measurement means 42$m$1. The reference structural member 41 may be the lens barrel, a lens barrel plate, the structural frame, or the like.

The optical element micro-motion mechanism 61$m$1 controls the positioning of the first movable portion 1$m$1 in the six axis directions (at least three axis directions) relative to the reference structural member 41 based on the measurement information from the non-contact measurement means 42$m$1. The first movable portion 1$m$1 may include the optical element 32$m$1. Alternatively, the first movable portion 1$m$1 may include a holding mechanism 31$m$1 and an optical element holding block 30$m$1, which are used for holding the optical element 32$m$1 in addition to the optical element 32$m$1.

A product value of a natural frequency and an attenuation factor in an optical element positioning device is made to nearly coincide with a product value of a natural frequency and an attenuation factor in an optical element positioning device for an optical element having a highest optical sensitivity, which is composed of a holding mechanism, an optical element holding block, and a drive mechanism. With respect to the products of the natural frequencies and the attenuation factors, for which the coincidence is required, the products of the natural frequencies and the attenuation factors are made to nearly coincide with each other in the three axis directions orthogonal to one another and all or any of rotation directions about the three axes. In particular, it is important that the products of the natural frequencies and the attenuation factors at lowest orders in the respective axes are made to nearly coincide with each other. The degree that the near coincidence is required is desirably set to be within ±20% or ±10% of the product of the natural frequency and the attenuation factor in the positioning device for the optical element having the highest optical sensitivity.

A movable portion including the first optical element 32$m$1 is referred to as "the first movable portion" 1$m$1, and a movable portion including the second optical element 32$m$2 is referred to as "a second movable portion" 1$m$2. Here, the first movable portion is set to 1$m$1, however it can be set to 1$m$2, 1$m$3, or 1$m$4.

A parallel link mechanism using an actuator including a piezoelectric element or a six-axis micro-motion mechanism using a linear motor and the like is considered as the drive mechanism 29$m$1 capable of driving the first movable portion 1$m$1, in the six axis directions relative to a fixed portion 2$m$1. In order to minimize a difference between the transferabilities of a plurality of optical element positioning mechanisms, it is desirable to standardize the fundamentals of the plurality of optical element positioning mechanisms. For example, it is preferable to standardize the plurality of optical element positioning mechanisms at any one of the parallel link mechanism and the linear motor. Of course, other than the linear motor and the parallel line mechanism, a drive mechanism in which a problem of contamination which becomes a cause of degas in a high vacuum region does not arise, may be employed for the positioning mechanism.

Here, the six-axis micro-motion mechanism using the linear motor is used as the drive mechanism $29m1$. A PID compensator is used as the compensator. A transfer function of the PID compensator is expressed by the following expression, $$Gc = Kpm1\left(1 + \frac{Fim1 \times 2\pi}{s} + \frac{s}{Fdm1 \times 2\pi}\right),$$

where $Kpm1$ represents a proportional gain of the PID compensator, $Fim1$ represents a break frequency of the integrator, and $Fdm1$ represents a break frequency of the differentiator.

Figure 2:
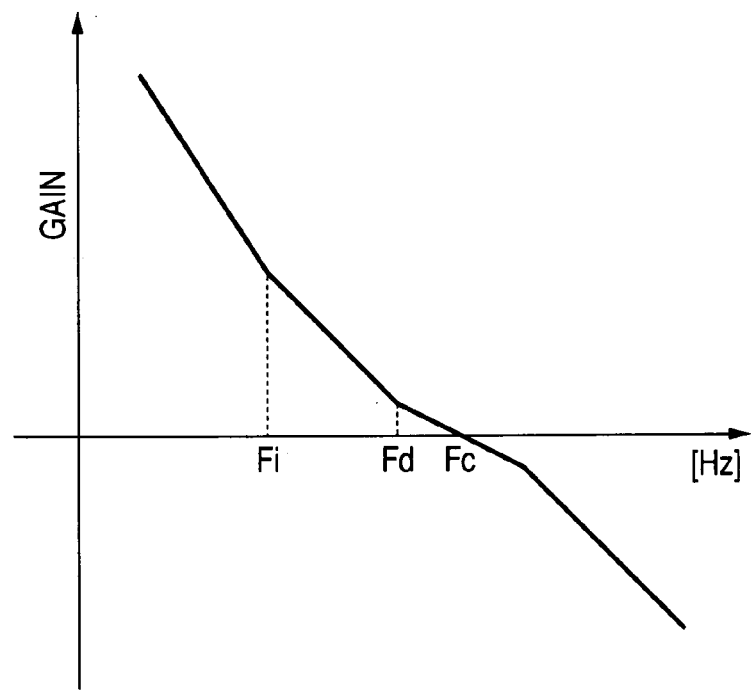
FIG. 2 is a graph showing a transfer characteristic of a movable portion including an optical element as shown in FIG. 1.

FIG. 2 shows an open loop transfer characteristic of the first movable portion $1m1$. A point at which the open loop transfer characteristic crosses 0 [dB] is referred to as a crossover frequency $Fcm1$ shown in FIG. 2 as Fc. The proportional gain is expressed by the following expression, $$Kpm1 = Mm1 \times (Fdm1 \times 2\pi) \times (Fcm1 \times 2\pi),$$

where $Fcm1$ represents the cross over frequency and $Mm1$ represents mass or moment of inertia of the first movable portion $1m1$.

Figure 3:
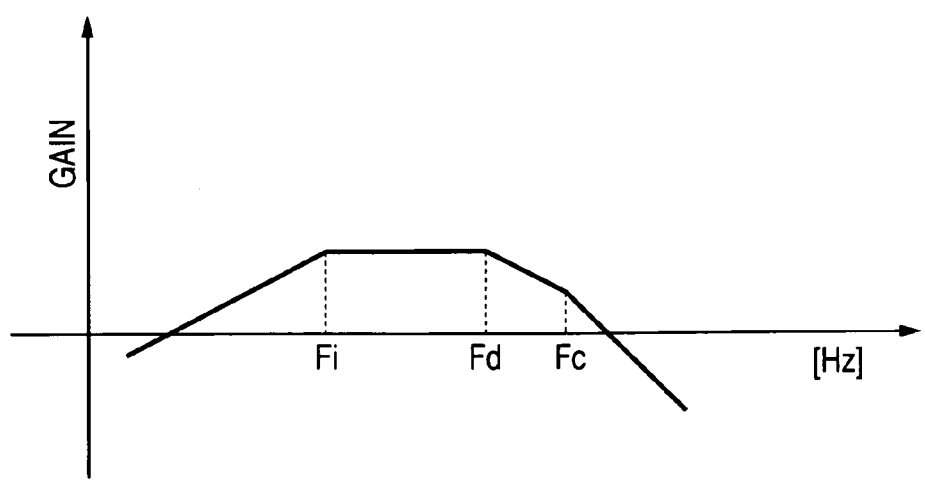
FIG. 3 is a graph showing a transfer characteristic of a disturbance in the movable portion including the optical element as shown in FIG. 1.

FIG. 3 shows a transfer characteristic from a displacement of a lens barrel 25 to a displacement of the first movable portion $1m1$, which are caused by the disturbance. The transferability of the disturbance between the frequency $Fim1$ and the frequency $Fdm1$, where the transferability of the disturbance is maximum, is expressed by the following expression, $$Gd1\max = \frac{k1 + c1s}{Mm1 \times (Fdm1 \times 2\pi) \times (Fcm1 \times 2\pi)},$$

where $k1$ represents rigidity between the lens barrel 25 and the first movable portion $1m1$ and $c1$ represents an attenuation factor.

A maximum displacement of the first movable portion $1m1$ which is caused by the disturbance is expressed by the following expression, $$e1 = \frac{k1 + c1s}{Mm1 \times (Fdm1 \times 2\pi) \times (Fcm1 \times 2\pi)} Dx,$$

where $Dx$ represents the displacement lens barrel 25 which is caused by the disturbance.

Similarly, a maximum displacement of the second movable portion $1m2$ which is caused by the disturbance is expressed by the following expression.

$$e2 = \frac{k2 + c2s}{Mm2 \times (Fdm2 \times 2\pi) \times (Fcm2 \times 2\pi)} Dx$$

A synchronization error between the first movable portion $1m1$ and the second movable portion $1m2$ is expressed by the following expression.

$$e = e1 - e2 = \left(\frac{k1 + c1s}{Mm1 \times (Fdm1 \times 2\pi) \times (Fcm1 \times 2\pi)} - \frac{k2 + c2s}{Mm2 \times (Fdm2 \times 2\pi) \times (Fcm2 \times 2\pi)}\right)$$

In order to obtain a more accurate imaging relationship, it is necessary to minimize the synchronization error of the respective movable portions. Therefore, a difference between the transfer characteristics of the respective movable portions to the disturbance may be minimized as much as possible. That is, it is desirable that values such as masses or moments of inertia Mm of the movable portions, rigidities k1 of the movable portions and the fixed portions, break frequencies Fim of the integrators of the PID compensators, break frequencies Fdm of the differentiators of the PID compensators, and crossover frequencies Fcm are made completely equal to each other. However, mass or moment of inertia Mm of an optical element $32m$, the rigidity k1 between the movable portion and the fixed portion, and the attenuation factor c1 are changed for each movable portion. Thus, the values of $Fdm1$, $Fcm1$, $Fdm2$, and $Fcm2$ are adjusted so as to control a difference between the transmissibilities of the disturbances to the movable portions, which is expressed by the following expression, within a predetermined range, here, a range of $\frac{1}{10}$ or less or a range of $\frac{1}{100}$ or less. After positional information of the controlled object in the six axis directions are obtained from the measurement information by using a decoupling matrix, the compensator may be adjusted for each axis.

$$Gd1 - Gd2 = \left(\frac{k1 + c1s}{Mm1 \times (Fdm1 \times 2\pi) \times (Fcm1 \times 2\pi)} - \frac{k2 + c2s}{Mm2 \times (Fdm2 \times 2\pi) \times (Fcm2 \times 2\pi)}\right)$$

In order to improve a response of the movable portion to a target value, the crossover frequencies $Fcm1$ and $Fcm2$ are maximized. Similarly, the break frequency of the differentiator of the PID compensator and the crossover frequency are adjusted between the movable portion $1m1$ and a movable portion $1m3$ and between the movable portion $1m1$ and a movable portion $1m4$.

Thus, the projection optical system 55 can be constructed in which each of the movable portions exerts a very superior synchronization performance to the disturbance. In this embodiment, the PID compensator is used. However, another control means which serves as the PID compensator may be used.

Embodiment 2

Embodiment 2 is a modified example of Embodiment 1. The PID compensator is used as in Embodiment 1. A point different from Embodiment 1 will be mainly described. A displacement X can be expressed by $A/\omega^2$, where A represents acceleration and $\omega$ represents an angular frequency (obtained by multiplying a frequency by $2\pi$). As the frequency increases, the displacement X reduces by the amount of the square thereof. In contrast to this, as the frequency reduces, the displacement X increases by the amount of the square thereof. That is, when the acceleration is kept constant, a vibration amplitude becomes larger with reducing the frequency. Therefore, in the low frequency band region, it is important to control the difference between the transmissibilities of the disturbances to the two optical elements within a predetermined range, thereby suppressing the synchronization error of the two optical elements within an allowable range. In Embodiment 2, a difference between the transmissibilities of the disturbances in the respective movable portions including the optical elements at a low frequency (in a frequency band region equal to or smaller than the frequency Fim) is controlled within the predetermined range. Such a method will be described using the first movable portion $1m1$ and the second movable portion $1m2$.

The difference between the transmissibilities of the disturbances in the first and second movable portions in a frequency band region equal to or smaller than the frequency Fim1 and a frequency Fim2 is expressed by the following expression (frequency region equal to or smaller than Fi in FIG. 3. Fim1 is shown in FIG. 3 as Fi).

$$Gd1 - Gd2 = \left( \frac{(k1+c1s)s}{Mm1 \times (Fdm1 \times 2\pi) \times (Fcm1 \times 2\pi)(Fim1 \times 2\pi)} - \frac{(k2+c2s)s}{Mm2 \times (Fdm2 \times 2\pi) \times (Fcm2 \times 2\pi) \times (Fim2 \times 2\pi)} \right)$$

The values of Fdm1, Fim1, Fcm1, Fdm2, Fim2, and Fcm2 are adjusted so as to control the difference between the transmissibilities of the disturbances as expressed by the above-mentioned expression within a predetermined range, here, a range of $1/10$ or less or a range of $1/100$ or less.

Similarly, the break frequency of the integrator of the PID compensator, the break frequency of the differentiator thereof, and the crossover frequency are adjusted between the first movable portion $1m1$ and the third movable portion $1m3$ and between the first movable portion $1m1$ and the fourth movable portion $1m4$.

Thus, the projection optical system 55 can be constructed in which each of the movable portions exerts a very superior synchronization performance to the disturbance.

Embodiment 3

Figure 10:
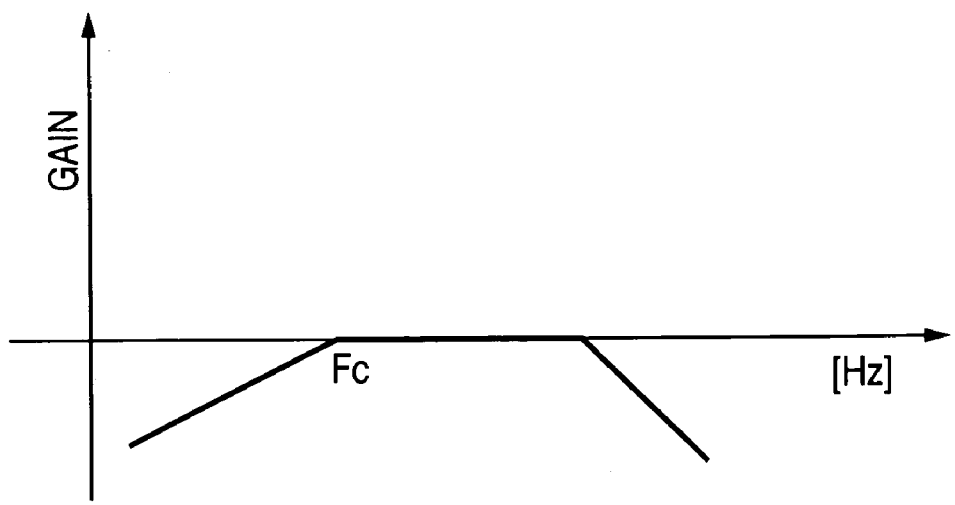
FIG. 10 is a graph showing the transfer characteristic of the disturbance in the movable portion including the optical element as shown in FIG. 1.

Embodiment 3 is a modified example of Embodiments 1 and 2. In Embodiment 3, a parallel link mechanism is used for the drive mechanism $29m1$, $29m2$, $29m3$, and $29m4$. A PI compensator is used as the compensator. As in Embodiment 2, the difference between the transmissibilities of the disturbances in the respective movable portions including the optical elements at the low frequency (in the frequency band region equal to or smaller than the frequency Fc) is controlled within the predetermined range. A point different from Embodiments 1 and 2 will be mainly described. Such a method will be described using the first movable portion $1m1$ and the second movable portion $1m2$. The difference between the transmissibilities of the disturbances in the first and second movable portions in the frequency band region equal to or smaller than the frequencies Fcm1 and Fcm2 is expressed by the following expression (frequency region equal to or smaller than Fc in FIG. 10. Fcm1 is shown in FIG. 10 as Fc).

$$Gd1 - Gd2 = \frac{(k1+c1s)s}{(Fcm1 \times 2\pi)} - \frac{(k2+c2s)s}{(Fcm2 \times 2\pi)}$$

The values of Fcm1 and Fcm2 are adjusted so as to control the difference between the transmissibilities of the disturbances as expressed by the above-mentioned expression within the predetermined range, here, the range of $1/10$ or less or the range of $1/100$ or less. Similarly, the crossover frequency is adjusted between the first movable portion $1m1$ and the third movable portion $1m3$ and between the first movable portion $1m1$ and the fourth movable portion $1m4$. Thus, the projection optical system 55 can be constructed in which each of the movable portions exerts a very superior synchronization performance to the disturbance.

Embodiment 4

In Embodiment 4, optical system elements (elements of an optical system) other than the first optical system element (the first element of the optical system) supported by the fixed portion through the holding mechanism are controlled to follow the positional displacement of the first optical system element. Thereby, a relative positional relationship between the first optical system element and the other optical system elements can be maintained (the relationship may depend on a target position for at least one of the first optical system element and the other optical system elements).

It is preferable that the first optical system element has the highest optical sensitivity among the optical system elements of the projection optical system. Here, the optical sensitivity indicates a degree of or a sensitivity to change in an imaging performance due to eccentricity of the optical system element, a tilt thereof, a displacement of position toward an optical axis, or the like. That is, the optical sensitivity indicates the amount of change in the imaging performance due to the eccentricity of the optical system element, the tilt thereof, the displacement of position toward the optical axis, or the like.

Following control method of optical system elements will be described hereinafter.

Figure 4A:
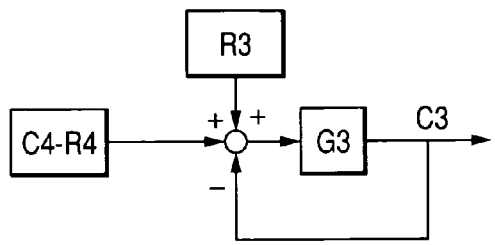
FIGS. 4A and 4B show block diagrams of control of optical system elements other than an optical system element to follow the optical system element.

Assuming that the optical element $32m4$ in FIG. 1 be the first optical system element, $32m3$ be the optical system element which is controlled to follow, R4 be a targeted value of the optical element $32m4$, C4 be the positional information on the optical element $32m4$, R3 be a targeted value of the movable portion $1m3$ containing optical element $32m3$ (the targeted value R3 can be zero), C3 be a positional information on the movable portion $1m3$, and G3 be the transfer characteristic from the fixed portion to the movable portion $1m3$, the control of the optical element $32m3$ to follow the optical element $32m4$ is shown in a block diagram in FIG. 4A. Here, the diagram shows a block diagram of one-axis following control for simplicity. In order to perform six-axis following control, a decoupling matrix needs to be added to the block diagram shown in FIG. 4A. And additional compensator needs to be added to the block diagram in order to perform an aberration correction or the like.

With above configuration, relative positional relationship between optical elements $32m4$ and $32m3$ can be maintained (the relationship may depend on a target position for at least one of the optical elements $32m4$ and $32m3$). As a result, a projection optical system, which is strong to disturbance, can be realized.

Embodiment 5

Embodiment 5 is a variation of Embodiment 4. Points different from Embodiment 4 will be mainly described. In Embodiment 5, the first optical system element has a drive mechanism, and configures feedback-control system. The other optical system elements of the optical system are controlled to follow the positional displacement of the first optical system element as in Embodiment 4. Thereby, the relative positional relationship between the first optical system element and the other optical system elements can be maintained (the relationship may depend on a target position for at least one of the first optical system element and the other optical system elements).

The method of following control of optical system elements will be described hereinafter.

Figure 4B:
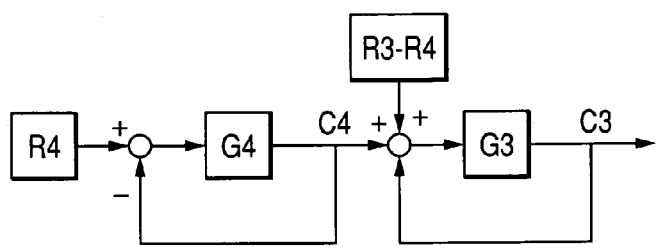

Assuming that the optical element $32m4$ in FIG. 1 be the first optical system element, $32m3$ be the optical system element which is controlled to follow, R4 be a targeted value of the movable portion $1m4$ having the optical element $32m4$, C4 be the positional information on the movable portion $1m4$, G4 be the transfer characteristic from the fixed portion to the movable portion $1m4$, R3 be a targeted value of the movable portion $1m3$ having optical element $32m3$ (the targeted value R3 can be zero), C3 be a positional information on movable portion $1m3$, and G3 be the transfer characteristic from the fixed portion to the movable portion $1m3$, the control of the optical element $32m3$ to follow the optical element $32m4$ can be shown in a block diagram in FIG. 4B. Here, the diagram shows a block diagram of one-axis following control for simplicity. In order to perform six-axis following control, a decoupling matrix needs to be added to the block diagram shown in FIG. 4B. And in order to perform an aberration correction or the like, an additional compensator needs to be added to the block diagram.

With above configuration, relative positional relationship between optical elements $32m4$ and $32m3$ can be maintained (the relationship may depend on a target position for at least one of the optical elements $32m4$ and $32m3$). As a result, a projection optical system, which is strong to disturbance, can be realized.

Embodiment 6

In Embodiment 6, a wafer stage of an optical system is controlled to follow the positional displacement of the first optical system element (the first element of the optical system) supported by the fixed portion through the holding mechanism. Thereby, scanning and step operation can be performed while the wafer stage maintains the relative positional relationship with the first optical system element depending on the targeted position.

It is preferable that the first optical system element has the highest optical sensitivity among optical system elements of the projection optical system. Here, the optical sensitivity indicates a degree of or a sensitivity to change in an imaging performance due to eccentricity of the optical system element, a tilt thereof, a displacement of position toward an optical axis, or the like. That is, the optical sensitivity indicates the amount of change in the imaging performance due to the eccentricity of the optical system element, the tilt thereof, the displacement of position toward the optical axis, or the like.

The method of following control of wafer stage will be described hereinafter.

Figure 5A:
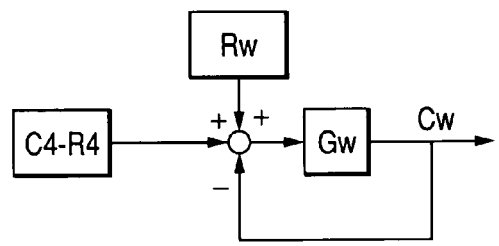
FIGS. 5A and 5B show block diagrams of control of a wafer stage to follow an optical system element.

Assuming that the optical element $32m4$ in FIG. 1 be the first optical system element, R4 be a targeted value of the optical element $32m4$, C4 be the positional information on the optical element $32m4$, Rw be the targeted value of the wafer stage 28, Cw be the positional information on the wafer stage, and Gw be the transfer characteristic of the wafer stage, the control of the wafer stage 28 to follow the optical element $32m4$ can be shown in a block diagram in FIG. 5A. Here, the diagram shows a block diagram of one-axis following control for simplicity. In order to perform six-axis following control, a decoupling matrix needs to be added to the block diagram shown in FIG. 5A. And in order to perform an aberration correction or the like, an additional compensator needs to be added to the block diagram. Thereby, scanning and step operation can be performed while the wafer stage 28 maintains the relative positional relationship with the optical element $32m4$ depending on the targeted value.

In order to control the reticle (mask) stage to follow the first optical system element, the control can be performed as the case of above described wafer stage. As a result, an exposure apparatus, which is strong to disturbance, can be realized.

Embodiment 7

Embodiment 7 is a variation of Embodiment 6. Points different from Embodiment 6 will be mainly described. In Embodiment 7, the first optical system element has a drive mechanism, and configures feedback-control system. The wafer stage is controlled to follow the positional displacement of the first optical system element as in Embodiment 6. Thereby, scan and step operation can be performed while the wafer stage maintains relative positional relationship with the first optical system element depending on the targeted value.

The method of following control of optical system elements will be described hereinafter.

Figure 5B:
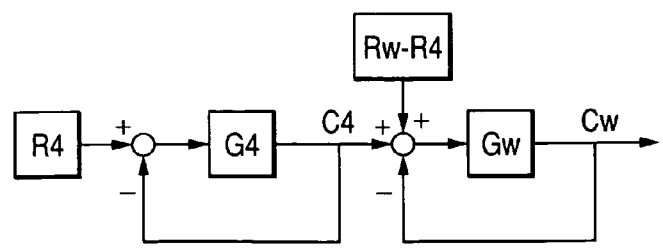

Assuming that the optical element $32m4$ in FIG. 1 be the first optical system element, R4 be a targeted value of the movable portion $1m4$ having the optical element $32m4$, C4 be the positional information on the movable portion $1m4$, G4 be the transfer characteristic from the fixed portion to the movable portion $1m4$, Rw be the targeted value of the wafer stage 28, Cw be the positional information on wafer stage, and Gw be the transfer characteristic of the wafer stage, the control of the wafer stage 28 to follow the optical element $32m4$ can be shown in a block diagram in FIG. 5B. Here, the diagram shows a one-axis following control for simplicity. In order to perform six-axis following control, a decoupling matrix needs to be added to the block diagram shown in FIG. 5B. And in order to perform an aberration correction or the like, an additional compensator needs to be added to the block diagram.

Thereby, scan and step operation can be performed while the wafer stage 28 maintains the relative positional relationship with the optical element $32m4$ depending on the targeted value.

In order to control the reticle (mask) stage to follow the first optical system element, the control can be performed as the case of above described wafer stage. As a result, an exposure apparatus, which is strong to disturbance, can be realized.

Embodiment 8

The present invention can be applied not only to the optical element but also between, for example, the lens barrel 25 and the wafer stage 27. Embodiment 6 will be described with reference to FIG. 1. The lens barrel 25 is rigidly connected with a structural frame 24. The structural frame 24 is supported on a base 22 through structural mounts 21. The wafer stage 27 is supported on a wafer stage plate 23 through a weight compensation spring, a wiring, and a pipe. The wafer stage plate 23 is connected with the base 22 through wafer stage mounts 20. Naturally, it is impossible to perform ideal rigid connection. Here, the rigid connection indicates substantially rigid connection, in particular, connection which is substantially more rigid than the connection between the movable potion ($1m1$, for example) including the optical element and the fixed portion ($2m1$, for example). Of course, the rigid connection is not necessarily performed. The adjustment may be performed so as to eliminate an error of transmissibility (transfer coefficient) including a natural frequency and an attenuation factor (coefficient), between the lens barrel and the structural frame.

A product Aw of the primary natural frequency and the attenuation factor between the wafer stage and the base is expressed by Fnw·ζw, where Fnw represents the first order natural frequency between the wafer stage and the base and ζw represents an attenuation factor therebetween. A product Ap of the primary natural frequency and the attenuation factor between the structural frame and the base is expressed by Fnp·ζp, where Fnp represents the first order natural frequency between the structural frame and the base and ζp represents an attenuation factor therebetween.

When Fnw·ζw is used as a reference, by adjusting the values of Fnp, ζp, Fnw, and ζw so as to establish a relationship, (Fnp·ζp−Fnw·ζw)/(Fnw·ζw)=±20% (or ±10%), it is possible to construct an exposure apparatus system strongly resistant to floor vibration.

In practice, the values of Fnw, ζw, and Fnp are determined by a mechanical structure in many cases. However, the value of ζp can be electrically adjusted. Therefore, the value of ζp is adjusted so as to satisfy the above-mentioned relationship expression.

In this embodiment, the structure including the wafer stage mounts 20 is used. However, a structure which does not include the wafer stage mounts 20 may be used.

Embodiment 9

Figure 6:
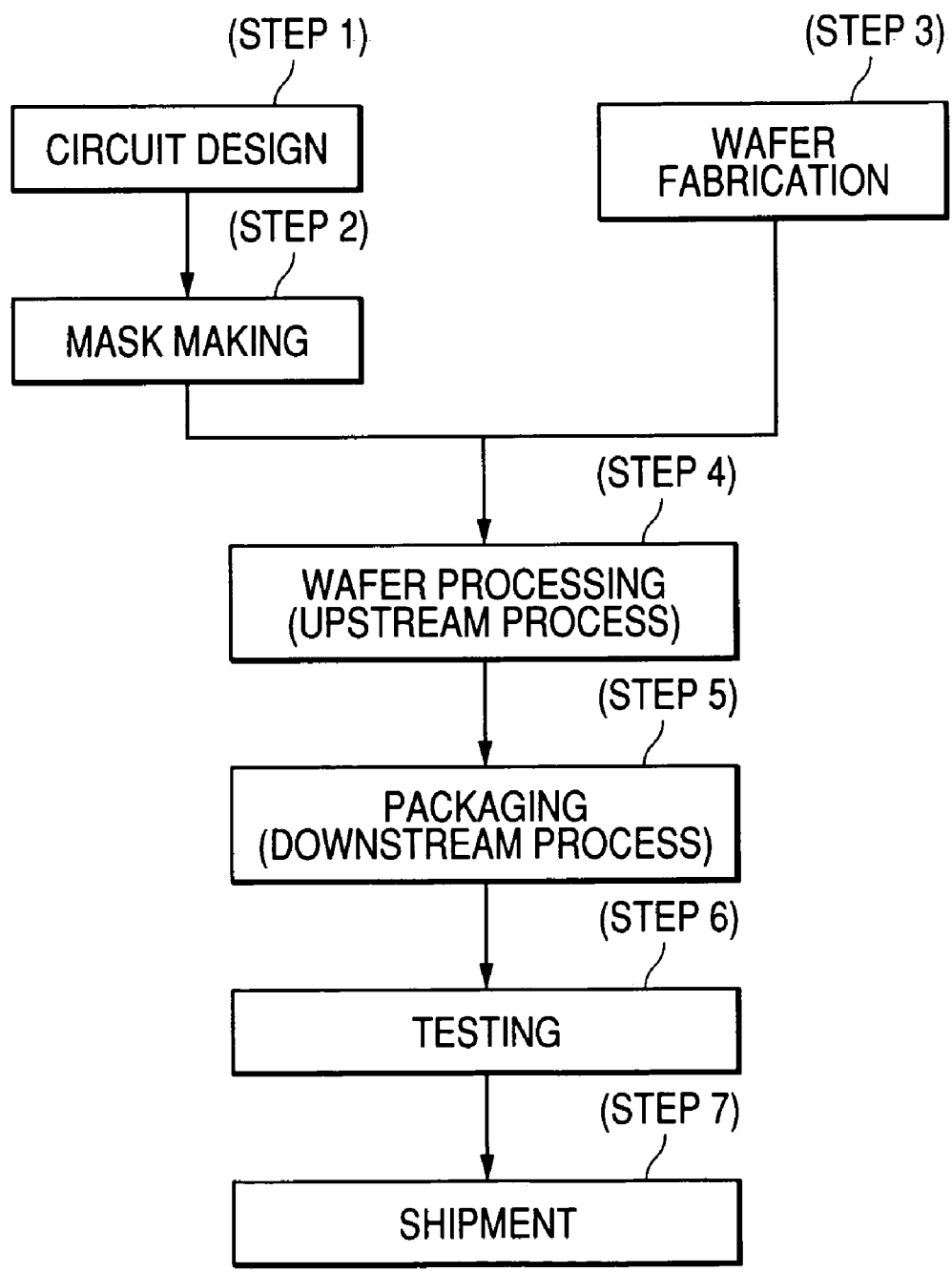
FIG. 6 is a flow chart for explaining fabrication of a device (including a semiconductor chip such as an IC or an LSI, an LCD, or a CCD)

Next, a device fabrication method using the above-mentioned exposure apparatus according to Embodiment 7 will be described with reference to FIGS. 6 and 7. FIG. 6 is a flow chart for explaining fabrication of a device (including a semiconductor chip such as an IC or a LSI, a LCD, or a CCD). Hereinafter, an example of fabrication of the semiconductor chip will be described. In Step 1 (circuit design), a device is designed. In Step 2 (mask making), a mask on which a designed circuit pattern is formed is made. In step 3 (wafer formation), a wafer is formed using a material such as silicon. In Step 4 (wafer processing), which is called an upstream process, an actual circuit is formed on a wafer by a lithography technique using the mask and the wafer. Step 5 (packaging), which is called a downstream process, is a process for of fabricating a semiconductor chip using the wafer produced in Step 4 and includes an assembly step (dicing and bonding) and a packaging step (chip sealing). In Step 6 (testing), tests such as an operation check test and a duration test are performed on the semiconductor chip fabricated in Step 5. The semiconductor chip is completed through the steps and then shipped (Step 7).

Figure 7:
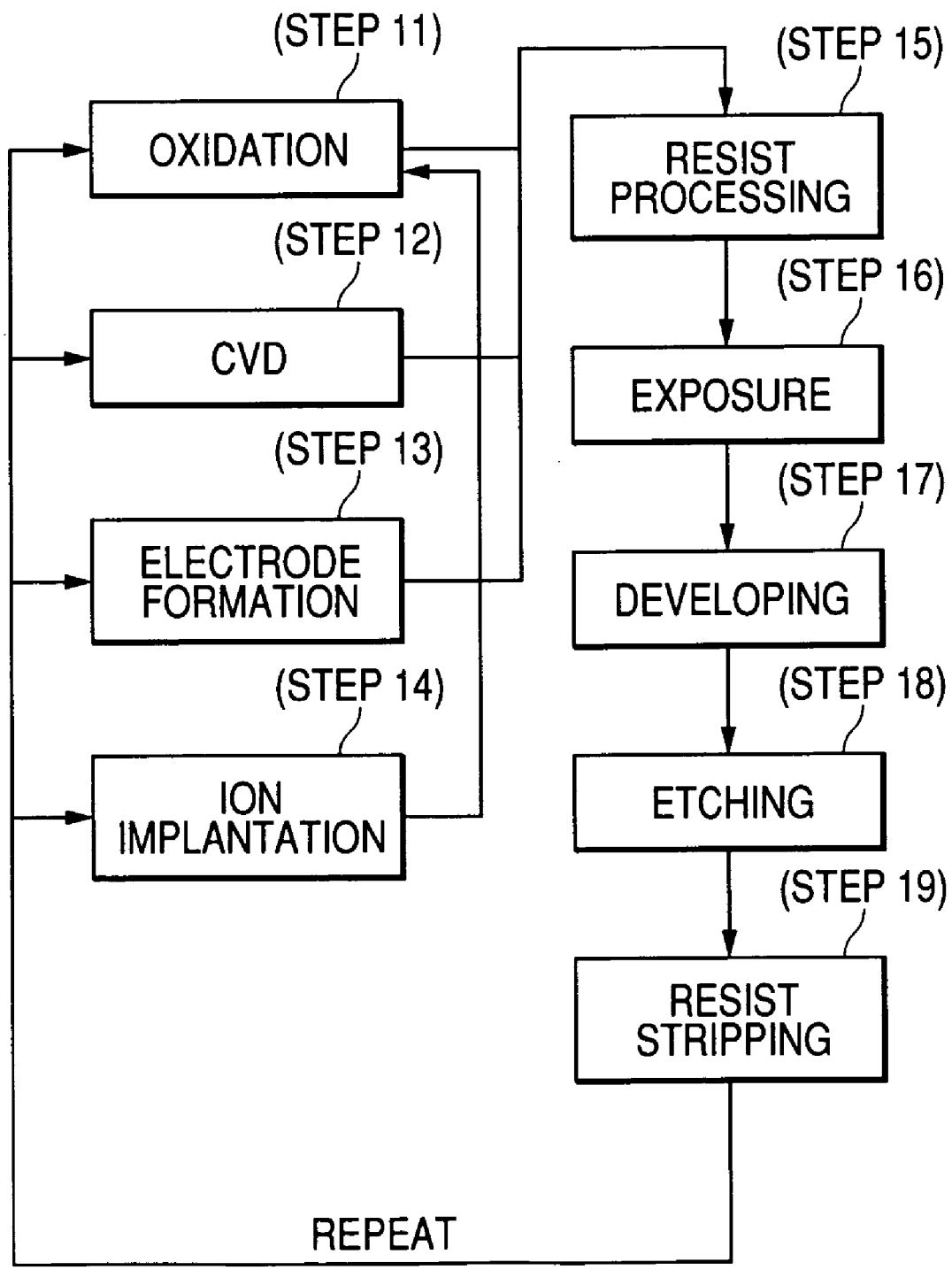
FIG. 7 is a detailed flow chart showing a wafer process in Step 4 shown in FIG. 6.

FIG. 7 is a detail flow chart showing the wafer process in Step 4 shown in FIG. 6. In Step 11 (oxidation), a surface of the wafer is oxidized. In Step 12 (CVD), an insulating film is formed on the surface of the wafer. In Step 13 (electrode formation), electrodes are formed on the wafer by evaporation or the like. In Step 14 (ion implantation), ions are implanted into the wafer. In Step 15 (resist processing), a photosensitive agent is applied to the wafer. In Step 16 (exposure), the circuit pattern of the mask is exposed to the wafer using an exposure apparatus 1. In step 17 (developing), the exposed wafer is developed. In Step 18 (etching), a portion other than a resist image obtained by developing is removed. In Step 19 (resist stripping), an unnecessary resist after etching is removed. Those steps are repeated, so that multiple circuit patterns are formed on the wafer. In the device fabrication method according to this embodiment, the disturbance characteristics of the plurality of (reflection) optical elements coincide with each other or the difference between the disturbance characteristics is within the allowable range. Therefore, the synchronization error of the respective optical elements is controlled within the allowable range, so that a desirable imaging relationship can be achieved and a high-grade device can be fabricated. Thus, the device fabrication method using the exposure apparatus and the resultant device each serve as an aspect of the present invention.

The preferred embodiments of the present invention are described. However, the present invention is not limited to those and therefore various modifications and changes can be made without departing from the scope of the present invention. For example, in those embodiments, the disturbance characteristics of the optical elements serving as the positioning controlled objects are made to coincide with the disturbance characteristics with respect to the original plate, the wafer, and the other optical elements of the projection optical system, or the difference therebetween is controlled within the allowable range. According to the present invention, with respect to at least two optical elements, that is, an optical element composing the projection optical system and another optical element selected from optical elements which compose the reticle or the mask, the member to be exposed, and the projection optical system, the disturbance characteristics are made to coincide with each other or the difference therebetween is controlled within the allowable range. Software (program) or hardware that executes the positioning control method of the present invention and a memory that stores the program each serve as an aspect of the present invention.

In the embodiments, it is preferable that the synchronization and the coincidence are the complete synchronization and the complete coincidence, respectively. However, the present invention is not limited to those. When an error is 10% or less, more preferably, 5% or less, of one of the two elements with which the synchronization or the coincidence is to be achieved, it is assumed that the synchronization or the coincidence is achieved.

Hereinafter, embodiment modes of the present invention will be described.

Embodiment Mode 1

A projection optical system for projecting a pattern formed in a mask onto a member to be exposed, including: a plurality of optical elements which are disposed on an optical path from the mask to the member to be exposed; and a plurality of positioning mechanisms for positioning the plurality of optical elements, in which the plurality of positioning mechanisms are substantially identical to one another.

Embodiment Mode 2

A projection optical system according to Embodiment Mode 1, in which a first coefficient determined by a natural frequency and attenuation factor of a first positioning mechanism for positioning a first optical element of the plurality of optical elements nearly coincides with a second coefficient determined by a natural frequency and attenuation factor of a second positioning mechanism for positioning a second optical element of the plurality of optical elements.

Embodiment Mode 3

A projection optical system for projecting a pattern formed in a mask onto a member to be exposed, which has a plurality of optical elements, in which a first coefficient determined by a natural frequency and attenuation factor of a first positioning mechanism for positioning a first optical element of the plurality of optical elements nearly coincides with a second coefficient determined by a natural frequency and attenuation factor of a second positioning mechanism for positioning a second optical element of the plurality of optical elements.

Embodiment Mode 4

A projection optical system according to Embodiment Mode 2 or 3, in which, among precisions of positions and postures of the plurality of optical elements, precisions of a position and posture of the first optical element cause a maximum influence on an imaging performance of a projection image projected onto the member to be exposed.

Embodiment Mode 5

A projection optical system according to any one of Embodiment Modes 2 to 4, in which the first coefficient nearly coincides with the second coefficient in at least one direction selected from the group including three axis directions orthogonal to one another and rotational directions about the three axis directions.

Embodiment Mode 6

A projection optical system according to any one of Embodiment Modes 2 to 5, in which a first coefficient determined by a natural frequency and attenuation factor of the first positioning mechanism at a lowest order is made to nearly coincide with a second coefficient determined by a natural frequency and attenuation factor of the second positioning mechanism at a lowest order.

Embodiment Mode 7

A projection optical system according to any one of Embodiment Modes 2 to 6, in which, when the first coefficient is given by K1 and the second coefficient is given by K2, a condition $|K1-K2| \leq 0.2 \times k1$ is satisfied.

Embodiment Mode 8

A projection optical system according to any one of Embodiment Modes 2 to 6, in which, when the first coefficient is given by K1 and the second coefficient is given by K2, a condition $|K1-K21 \leq 0.1 \times k1$ is satisfied.

Embodiment Mode 9

A projection optical system according to any one of Embodiment Modes 2 to 8, in which, of a plurality of reflection surfaces of the reflection optical system, a final reflection surface closest to the member to be exposed on an optical path from the pattern to the member to be exposed is the first optical element.

Embodiment Mode 10

A projection optical system according to any one of Embodiment Modes 1 to 9, in which the plurality of positioning mechanisms which are substantially identical to one another use a parallel link mechanism.

Embodiment Mode 11

A projection optical system according to any one of Embodiment Modes 1 to 10, in which a difference between transmissibility of a disturbance to a first optical element of the plurality of optical elements in a predetermined frequency band region and transmissibility of a disturbance to a second optical element of the plurality of optical elements in the predetermined frequency band region is equal to or smaller than $\frac{1}{10}$.

Embodiment Mode 12

A projection optical system according to any one of Embodiment Modes 1 to 11, in which a difference between transmissibility of a disturbance to a first optical element of the plurality of optical elements in a predetermined frequency band region and transmissibility of a disturbance to a second optical element of the plurality of optical elements in the predetermined frequency band region is equal to or smaller than $\frac{1}{100}$.

Embodiment Mode 13

A projection optical system according to any one of Embodiment Modes 1 to 12, in which a difference between transmissibility of a disturbance to a first optical element of the plurality of optical elements in a predetermined frequency band region and transmissibility of a disturbance to a second optical element of the plurality of optical elements in the predetermined frequency band region is equal to or smaller than $\frac{1}{10}$ of the transmissibility of the disturbance to the first optical element.

Embodiment Mode 14

A projection optical system according to any one of Embodiment Modes 1 to 13, in which a difference between transmissibility of a disturbance to a first optical element of the plurality of optical elements in a predetermined frequency band region and transmissibility of a disturbance to a second optical element of the plurality of optical elements in the predetermined frequency band region is equal to or smaller than $\frac{1}{100}$ of the transmissibility of the disturbance to the first optical element.

Embodiment Mode 15

A projection optical system according to any one of Embodiment Modes 11 to 14, in which the predetermined frequency band region is equal to or smaller than 80 Hz.

Embodiment Mode 16

A projection optical system according to any one of Embodiment Modes 11 to 14, in which the predetermined frequency band region is equal to or smaller than 100 Hz.

Embodiment Mode 17

A projection optical system according to any one of Embodiment Modes 11 to 16, in which a width of the predetermined frequency band region is equal to or larger than 10 Hz.

Embodiment Mode 18

A projection optical system according to any one of Embodiment Modes 11 to 17, in which a width of the predetermined frequency band region is equal to or larger than 15 Hz.

Embodiment Mode 19

A projection optical system according to any one of Embodiment Modes 11 to 18, in which the predetermined frequency band region is a band region lower than a crossover frequency of a control system for the plurality of positioning mechanism.

Embodiment Mode 20

An exposure apparatus, including: an illumination optical system for illuminating the mask with light from a light source; and the projection optical system for projecting the pattern of the mask to the member to be exposed for exposure, according to any one of Embodiment Modes 1 to 19.

Embodiment Mode 21

An exposure apparatus, including:
a projection optical system for projecting a pattern formed on a mask to a member to be exposed, including a wafer, which has a plurality of optical elements and a plurality of optical element positioning mechanisms for positioning the plurality of optical elements;
a mask stage having a mask positioning mechanism for positioning the mask; and
a wafer stage having a wafer positioning mechanism for positioning the wafer,
in which products of natural frequencies and attenuation factors of at least two positioning mechanisms selected from the group including the plurality of optical element positioning mechanisms, the mask positioning mechanism, and the wafer positioning mechanism are substantially equal to each other.

Embodiment Mode 22

An exposure apparatus according to Embodiment Mode 21, in which a product of a natural frequency and attenuation factor of a first positioning mechanism selected from the group including the plurality of optical element positioning mechanisms, the mask positioning mechanism, and the wafer positioning mechanism is 80% to 125% of a product of a natural frequency and attenuation factor of a second positioning mechanism selected from the group including the plurality of optical element positioning mechanisms, the mask positioning mechanism, and the wafer positioning mechanism.

Embodiment Mode 23

An exposure apparatus according to Embodiment Mode 21 or 22, in which a product of a natural frequency and attenuation factor of a first positioning mechanism selected from the group including the plurality of optical element positioning mechanisms, the mask positioning mechanism, and the wafer positioning mechanism is 80% to 125% of a product of a natural frequency and attenuation factor of a second positioning mechanism selected from the group including the plurality of optical element positioning mechanisms, the mask positioning mechanism, and the wafer positioning mechanism.

Embodiment Mode 24

An exposure apparatus according to any one of Embodiment Modes 21 to 23, in which a product of a natural frequency and attenuation factor of each of positioning mechanisms including the plurality of optical element positioning mechanisms, the mask positioning mechanism, and the wafer positioning mechanism is within a range of 80% to 125% of a product of a natural frequency and attenuation factor of a positioning mechanism selected from the group including the plurality of optical element positioning mechanisms, the mask positioning mechanism, and the wafer positioning mechanism (preferably, within a range of 90% to 111%).

Embodiment Mode 25

An exposure apparatus including an illumination optical system for illuminating a mask with light from a light source and a projection optical system for projecting a pattern formed in the mask located on a mask stage to a member to be exposed, which is located on a wafer stage, the projection optical system having at least one optical element, including:
position information obtaining means for obtaining position information of a first optical element of the projection optical system and position information of one of the mask stage, the wafer stage, and a second optical element of the projection optical system; and
positioning means for positioning the first optical element and one of the mask stage, the wafer stage, and the second optical element of the projection optical system such that a difference between transmissibility of a disturbance to the first optical element in a predetermined frequency band region and transmissibility of a disturbance to one of the mask stage, the wafer stage, and the second optical element of the projection optical system in the predetermined frequency band region is equal to or smaller than $1/10$ of the transmissibility of the disturbance to the first optical element.

Embodiment Mode 26

An exposure apparatus according to Embodiment Mode 25, in which the positioning means positions the first optical element and one of the mask stage, the wafer stage, and the second optical element of the projection optical system such that the difference between the transmissibility of the disturbance to the first optical element in the predetermined frequency band region and the transmissibility of the disturbance to one of the mask stage, the wafer stage, and the second optical element of the projection optical system in the predetermined frequency band region is equal to or smaller than $1/100$ of the transmissibility of the disturbance to the first optical element.

Embodiment Mode 27

An exposure apparatus according to Embodiment Mode 25 or 26, in which the positioning means includes a mechanism for positioning the first optical element and a mechanism for positioning one of the mask stage, the wafer stage, and the second optical element of the projection optical system, each of which has a linear motor.

Embodiment Mode 28

An exposure apparatus according to Embodiment Mode 25 or 26, in which the positioning means includes a mechanism for positioning the first optical element and a mechanism for positioning one of the mask stage, the wafer stage, and the second optical element of the projection optical system, each of which has a parallel link mechanism.

Embodiment Mode 29

An exposure apparatus, including:
a projection optical system for projecting a pattern of a mask to a member to be exposed; a first movable portion for locating a first member; a first fixed portion for holding the first movable portion; a second movable portion for locating a second member; and a second fixed portion for holding the second movable portion,
in which a first coefficient determined by a natural frequency of the first movable portion and attenuation factors of the first movable portion and the first fixed portion is made to nearly coincide with a second coefficient determined by a natural frequency of the second movable portion and attenuation factors of the second movable portion and the second fixed portion, the natural frequency of the first movable portion is expressed from rigidities and attenuation factors of the first movable portion and the first fixed portion and mass or moment of inertia of the first movable portion, and the natural frequency of the second movable portion is expressed from rigidities and attenuation factors of the second movable portion and the second fixed portion and mass or moment of inertia of the second movable portion.

Embodiment Mode 30

An exposure apparatus according to Embodiment Mode 29, in which the second coefficient determined by a natural frequency and attenuation factor of the second positioning mechanism is within ±20% of the first coefficient determined by a natural frequency and attenuation factor of the first positioning mechanism.

Embodiment Mode 31

An exposure apparatus according to Embodiment Mode 29, in which the second coefficient determined by a natural frequency and attenuation factor of the second positioning mechanism is within ±10% of the first coefficient determined by a natural frequency and attenuation factor of the first positioning mechanism.

Embodiment Mode 32

An exposure apparatus, including:
a projection optical system for projecting a pattern of a mask to a member to be exposed; a first movable portion for locating a first member; a first fixed portion for holding the first movable portion; a second movable portion for locating a second member; a second fixed portion for holding the second movable portion; and
positioning means for positioning the first movable portion and the second movable portion such that a difference between a transmissibility of a disturbance to the first movable portion in a predetermined frequency band region and a transmissibility of a disturbance to the second movable portion in the predetermined frequency band region is equal to or smaller than 1/10 of the transmissibility of the disturbance to the first movable portion, the transmissibility of the disturbance to the first movable portion is expressed by a natural frequency of the first movable portion and attenuation factors of the first movable portion and the first fixed portion, the natural frequency of the first movable portion is expressed by rigidities and attenuation factors of the first movable portion and the first fixed portion and mass or moment of inertia of the first movable portion, the transmissibility of the disturbance to the second movable portion is expressed by a natural frequency of the second movable portion and attenuation factors of the second movable portion and the second fixed portion, and the natural frequency of the second movable portion is expressed from rigidities and attenuation factors of the second movable portion and the second fixed portion and mass or moment of inertia of the second movable portion.

Embodiment Mode 33

An exposure apparatus, including:
a projection optical system for projecting a pattern of a mask to a member to be exposed; a first movable portion for locating a first member; a first fixed portion for holding the first movable portion; a second movable portion for locating a second member; a second fixed portion for holding the second movable portion; a first measurement portion for measuring a position of the first movable portion; a second measurement portion for measuring a position of the second movable portion; a first drive portion for driving the first movable portion; a second drive portion for driving the second movable portion; a first compensator for controlling the first drive portion based on a measurement result of the first measurement portion, the first compensator including a first differentiator; a second compensator for controlling the second drive portion based on a measurement result of the second measurement portion, the second compensator including a second differentiator; and
positioning means for positioning the first movable portion and the second movable portion such that a difference between a transmissibility of a disturbance to the first movable portion in a predetermined frequency band region and a transmissibility of a disturbance to the second movable portion in the predetermined frequency band region is equal to or smaller than 1/10 of the transmissibility of the disturbance to the first movable portion, the transmissibility of the disturbance to the first movable portion is expressed by rigidity and attenuation factor of the first drive portion, mass or moment of inertia of the first movable portion, a break frequency of the first differentiator of the first compensator, and a crossover frequency of a control system for the first movable portion, and the transmissibility of the disturbance to the second movable portion is expressed by rigidity and attenuation factor of the second drive portion, mass or moment of inertia of the second movable portion, a break frequency of the second differentiator of the second compensator, and a crossover frequency of a control system for the second movable portion.

Embodiment Mode 34

An exposure apparatus, including:
a projection optical system for projecting a pattern of a mask to a member to be exposed; a first movable portion for locating a first member; a first fixed portion for holding the first movable portion; a second movable portion for locating a second member; a second fixed portion for holding the second movable portion; a first measurement portion for measuring a position of the first movable portion; a second measurement portion for measuring a position of the second movable portion; a first drive portion for driving the first movable portion; a second drive portion for driving the second movable portion; a first compensator for controlling the first drive portion based on a measurement result of the first measurement portion, the first compensator including a first integrator; a second compensator for controlling the second drive portion based on a measurement result of the second measurement portion, the second compensator including a second integrator; and positioning means for positioning the first movable portion and the second movable portion such that a difference between a transmissibility of a disturbance to the first movable portion in a predetermined frequency band region and a transmissibility of a disturbance to the second movable portion in the predetermined frequency band region is equal to or smaller than $1/10$ of the transmissibility of the disturbance to the first movable portion, the transmissibility of the disturbance to the first movable portion is expressed by rigidity and attenuation factor of the first drive portion, mass or moment of inertia of the first movable portion, a break frequency of the first integrator of the first compensator, and a crossover frequency of a control system for the first movable portion, and the transmissibility of the disturbance to the second movable portion is expressed by rigidity and attenuation factor of the second drive portion, mass or moment of inertia of the second movable portion, a break frequency of the second integrator of the second compensator, and a crossover frequency of a control system for the second movable portion.

Embodiment Mode 35

An exposure apparatus, including:

a projection optical system for projecting a pattern of a mask to a member to be exposed; a first movable portion for locating a first member; a first fixed portion for holding the first movable portion; a second movable portion for locating a second member; a second fixed portion for holding the second movable portion; a first measurement portion for measuring a position of the first movable portion; a second measurement portion for measuring a position of the second movable portion; a first drive portion for driving the first movable portion; a second drive portion for driving the second movable portion; a first compensator for controlling the first drive portion based on a measurement result of the first measurement portion, the first compensator including a first differentiator and a first integrator; a second compensator for controlling the second drive portion based on a measurement result of the second measurement portion, the second compensator including a second differentiator and a second integrator; and positioning means for positioning the first movable portion and the second movable portion such that a difference between a transmissibility of a disturbance to the first movable portion in a predetermined frequency band region and a transmissibility of a disturbance to the second movable portion in the predetermined frequency band region is equal to or smaller than $1/10$ of the transmissibility of the disturbance to the first movable portion, the transmissibility of the disturbance to the first movable portion is expressed by rigidity and attenuation factor of the first drive portion, mass or moment of inertia of the first movable portion, a break frequency of the first differentiator of the first compensator, a break frequency of the first integrator of the first compensator, and a crossover frequency of a control system for the first movable portion, and the transmissibility of the disturbance to the second movable portion is expressed by rigidity and attenuation factor of the second drive portion, mass or moment of inertia of the second movable portion, a break frequency of the second differentiator of the second compensator, a break frequency of the second integrator of the second compensator, and a crossover frequency of a control system for the second movable portion.

Embodiment Mode 36

An exposure apparatus according to any one of Embodiment Modes 32 to 35, in which the positioning means positions the first member and the second member such that a difference between the transmissibility of the disturbance to the first member in the predetermined frequency band region and the transmissibility of the disturbance to the second member in the predetermined frequency band region is equal to or smaller than $1/100$ of the transmissibility of the disturbance to the first optical element.

Embodiment Mode 37

An exposure apparatus according to any one of Embodiment Modes 32 to 36, in which the projection optical system includes a plurality of optical elements, and the first member is one of the plurality of optical elements.

Embodiment Mode 38

An exposure apparatus according to any one of Embodiment Modes 32 to 37, in which the projection optical system includes a plurality of optical elements, and the second member is one of the plurality of optical elements.

Embodiment Mode 39

An exposure apparatus according to any one of Embodiment Modes 32 to 37, in which the second movable portion is one of a mask stage for locating the mask and a wafer stage for locating the member to be exposed.

Embodiment Mode 40

An exposure apparatus according to any one of Embodiment Modes 25 to 39, in which the predetermined frequency band region is equal to or smaller than 80 Hz.

Embodiment Mode 41

An exposure apparatus according to any one of Embodiment Modes 25 to 40, in which the predetermined frequency band region is equal to or smaller than 100 Hz.

Embodiment Mode 42

An exposure apparatus according to any one of Embodiment Modes 25 to 41, in which a width of the predetermined frequency band region is equal to or larger than 10 Hz.

Embodiment Mode 43

An exposure apparatus according to any one of Embodiment Modes 25 to 41, in which a width of the predetermined frequency band region is equal to or larger than 15 Hz.

Embodiment Mode 44

An exposure apparatus, including:

a projection optical system including a plurality of optical elements;

a first measurement means for measuring a position of a first movable portion including one of the plurality of optical elements from a reference structural member;

a second measurement means for measuring a position of a second movable portion including another one of the plurality of optical elements from the reference structural member; and a second compensator for controlling a second drive means for driving the second movable portion based on measurement information of the measurement means, in which the second compensator is controlled such that the first movable portion is followed by the second movable portion, based on a measurement result of the first measurement means and a measurement result of the second measurement means.

Embodiment Mode 45

An exposure apparatus according to Embodiment Mode 44, in which the first movable portion includes an optical element having the highest optical sensitivity.

Embodiment Mode 46

An exposure apparatus, including: a projection optical system for projecting a pattern of a mask onto a member to be exposed, the projection optical system having a plurality of optical elements; a mask stage for locating the mask; drive means for driving the mask stage; a first measurement means for measuring a position of the mask stage from a reference structural member; a compensator for controlling the drive means based on measurement information of the measurement means; and a second measurement means for measuring a position of a movable portion including one of the plurality of optical elements from the reference structural member, in which the compensator is controlled such that the one of the plurality of optical elements is followed by the mask stage, based on a measurement result of the second measurement means.

Embodiment Mode 47

An exposure apparatus, including: a projection optical system for projecting a pattern of a mask onto a member to be exposed, the projection optical system having a plurality of optical elements; a wafer stage for locating the member to be exposed; drive means for driving the wafer stage; a first measurement means for measuring a position of the wafer stage from a reference structural member; a compensator for controlling the drive means based on measurement information of the measurement means; and a second measurement means for measuring a position of a movable portion including one of the plurality of optical elements from the reference structural member, in which the compensator is controlled such that the one of the plurality of optical elements is followed by the wafer stage, based on a measurement result of the second measurement means.

Embodiment Mode 48

An exposure apparatus according to Embodiment Mode 44 or 47, in which the one of the plurality of optical elements is, of the plurality of optical elements of the projection optical system, an optical element closest to the mask along an optical path of light exiting from the mask.

Embodiment Mode 49

An exposure apparatus according to Embodiment Mode 44 or 47, in which the one of the plurality of optical elements is, of the plurality of optical elements of the projection optical system, an optical element closest to the member to be exposed along an optical path of light exiting from the mask.

Embodiment Mode 50

An exposure apparatus according to any one of Embodiment Modes 25 to 49, in which the exposure apparatus utilizes exposure light having a wavelength of 2 nm to 40 nm.

Embodiment Mode 51

An exposure apparatus according to any one of Embodiment Modes 1 to 28, 37, and 38, in which each of the optical elements is a reflection optical element.

Embodiment Mode 52

A device fabricating method including the steps of: exposing the member to be exposed using the exposure apparatus according to any one of Embodiment Modes 24 to 50; and performing a predetermined process on the exposed member.

Embodiment Mode 53

A positioning method which is used for a projection optical system for projecting a pattern formed in a reticle or a mask to a member to be exposed, the projection optical system having at least two optical elements, the positioning method of positioning the at least two optical elements, including the steps of:

obtaining position information of each of the two optical elements;

positioning the two optical elements such that a difference between transmissibilities of disturbances to the two optical elements in a predetermined frequency band region is equal to or smaller than $1/10$; and controlling positioning of the two optical elements such that a difference between transmissibilities of disturbances to the two optical elements is equal to or smaller than $1/10$ of the transmissibility of the disturbance to one of the two optical elements, based on the position information, in which the projection optical system includes a plurality of optical elements, and the two optical elements include an optical element composing the projection optical system and another optical element selected from optical elements which compose the reticle or the mask, the member to be exposed, and the projection optical system.

Embodiment Mode 54

A positioning method according to Embodiment Mode 53, in which the controlling step includes the step of controlling positioning of the two optical elements in one selected from the group including three axis directions orthogonal to one another and rotational directions about the three axis directions.

The present invention is not limited to the above embodiments and various changes and modifications can be made within the spirit and scope of the present invention. Therefore, to apprise the public of the scope of the present invention the following claims are made.

This application claims priority from Japanese Patent Application Nos. 2003-326933 filed Sep. 18, 2003, and 2004-015832 filed Jan. 23, 2004, both of which are hereby incorporated by reference herein.

What is claimed is:

1. An apparatus which includes an optical system having a first element and a second element, and a support member which supports said optical system, said apparatus comprising:

a first control system which includes said first element and feedback-controls a position of said first element; and a second control system which includes said second element and feedback-controls a position of said second element, wherein said first control system and said second control system are configured such that a difference between a first transfer function between a displacement of said support member and a displacement of said first element and a second transfer function between the displacement of said support member and a displacement of said second element is not greater than $1/10$ with respect to at least a limited frequency band.

2. An apparatus according to claim 1, wherein said first control system and said second control system are configured such that the difference is not greater than $1/100$ with respect to at least the limited frequency band.

3. An apparatus according to claim 1, wherein at least one of said first and second elements comprises a reflection element.

4. An apparatus according to claim 1; wherein said apparatus is configured to expose an object to a pattern of extreme ultraviolet light using said optical system.

5. A method of manufacturing a device, the method comprising:

exposing an object to the pattern using an apparatus defined in claim 4;

developing the exposed substrate; and processing the developed substrate to manufacture the device.

6. An apparatus according to claim 2; wherein said apparatus is configured to expose an object to a pattern of extreme ultraviolet light using said optical system.

7. An apparatus according to claim 3; wherein said apparatus is configured to expose an object to a pattern of extreme ultraviolet light using said optical system.

8. An exposure apparatus which includes a projection optical system having a first optical element and a second optical element, and a support that supports the projection optical system, and is configured to expose a substrate to light via the projection optical system, the apparatus comprising:

a first control system which includes the first optical element and is configured to feedback-control a position of the first optical element; and a second control system which includes the second optical element and is configured to feedback-control a position of the second optical element, wherein the first control system and the second control system are configured such that a difference between a first transfer function between a displacement of the support and a displacement of the first optical element and a second transfer function between the displacement of the support and a displacement of the second optical element is not greater than $1/10$ with respect to at least a limited frequency band.

9. An apparatus according to claim 8, wherein the first control system and the second control system are configured such that the difference is not greater than $1/100$ with respect to at least the limited frequency band.

10. An apparatus according to claim 8, wherein at least one of the first and second optical elements comprises a reflection element.

11. An apparatus according to claim 8, wherein the apparatus is configured to expose the substrate to a pattern of extreme ultraviolet light via the projection optical system.

12. A method of manufacturing a device, the method comprising:

exposing a substrate to light using an exposure apparatus defined in claim 8;

developing the exposed substrate; and processing the developed substrate to manufacture the device.

* * * * *